United States Patent
Yugo et al.

(10) Patent No.: US 6,768,310 B2
(45) Date of Patent: Jul. 27, 2004

(54) METHOD AND DEVICE FOR DETECTING A CURRENT

(75) Inventors: Masaki Yugo, Kakogawa (JP); Minoru Gyoda, Kasai (JP); Hiroshi Egi, Kasai (JP)

(73) Assignee: Sanyo Electric Co., Ltd., Osaka (JP)

( * ) Notice: Subject to any disclaimer, the term of this patent is extended or adjusted under 35 U.S.C. 154(b) by 16 days.

(21) Appl. No.: 10/354,975

(22) Filed: Jan. 31, 2003

(65) Prior Publication Data

US 2003/0146756 A1 Aug. 7, 2003

(30) Foreign Application Priority Data

Feb. 1, 2002 (JP) .................................. 2002-026172

(51) Int. Cl.$^7$ ..................... G01N 27/02; G01R 19/00
(52) U.S. Cl. ................... 324/444; 324/117 R
(58) Field of Search .............................. 324/444, 439, 324/425, 713, 691, 76.39, 427, 117 R; 701/22, 29, 36; 702/57, 64; 180/65.3; 318/432; 320/149

(56) References Cited

U.S. PATENT DOCUMENTS

| | | | |
|---|---|---|---|
| 5,867,054 A | | 2/1999 | Kotowski |
| 6,320,339 B1 | * | 11/2001 | Lin et al. ................ 318/432 |
| 6,424,129 B1 | * | 7/2002 | Lethellier ................ 323/272 |
| 6,501,249 B1 | * | 12/2002 | Drori ..................... 320/149 |
| 6,590,396 B1 | * | 7/2003 | Zur et al. ................ 324/433 |
| 2002/0157882 A1 | * | 10/2002 | Kubo et al. ............. 180/65.3 |

OTHER PUBLICATIONS

Patent Abstracts of Japan, by Hiroyuki Yamada, entitled "Charged Condition Deciding Device For Battery", vol. 2000, No. 23, Feb. 10, 2001.
Patent Abstracts of Japan, by Ichiro Yamashina, entitled *Multiple Output Converter With Power Factor And Voltage Adjustment Function*, vol. 1996, No. 04, Apr. 30, 1996.

* cited by examiner

Primary Examiner—Jay Patidar
Assistant Examiner—Hoai-An D. Nguyen
(74) Attorney, Agent, or Firm—Wenderoth, Lind & Ponack, L.L.P.

(57) ABSTRACT

In the method for detecting a current, the current is detected by a first current sensor in a predetermined sampling period as a digital value, and is detected by a second current sensor in a period longer than the first current sensor with high accuracy as a digital value. In the method for detecting a current, the current during detecting-incapable time period, which is incapable of detecting the current during detecting timing for detecting the current during the predetermined period by the second current sensor, is complemented with the current value detected by the first current sensor.

16 Claims, 4 Drawing Sheets

METHOD AND DEVICE FOR DETECTING A CURRENT

This application is based on Application No. 2002-26172 filed in Japan on, Feb. 1, 2002, the content of which is incorporated hereinto by reference.

BACKGROUND OF THE INVENTION

The present invention relates to a method and a device for detecting a current with accuracy, and especially relates to a method and a device for detecting a current adequately in a rechargeable battery on-board of a hybrid car with accuracy.

An electric vehicle such as hybrid car, and so on, calculates the rest of the capacity of the rechargeable battery, which drives a motor for driving, with integrating the current of charging and discharging. At this time, it is very important to detect the current with accuracy, and to calculate the rest of the capacity of the rechargeable battery certainly. The reason is that the error of calculation of the rest of the capacity at calculating the current affects the life of the rechargeable battery, and further affects the driving condition. Because charging and discharging are controlled based on the rest of the capacity, if the rest of the capacity calculated with the current is not accurate, over-charging or over-discharging the rechargeable battery may deteriorate its characteristics. In addition, because the driving condition is controlled based on the rest of the capacity, the driving condition may also be deteriorated, for example the acceleration is getting poor. Especially in the rechargeable battery for a vehicle, charging and discharging are controlled to keep around 50% of the rest of the capacity, so as to maximize prolongation of the life. Using in this condition can minimize reduction of the battery performance. However, because charging and discharging the rechargeable battery in this range do not achieve full-charge or complete-discharge, it is difficult to correct the rest of the capacity. The reason is that the rest of the capacity should be corrected with full-charge or complete discharge in the battery. When the rest of the capacity is calculated with integrating the current of charging and discharging for a long time without correcting the rest of the capacity, the cumulated errors may be getting inaccuracy according to cumulating them, even each error is small. So that it is important to maximize the accuracy of detecting the current in charging and discharging.

There are two types of conventional current-detecting devices. One is a type detecting a current with magnetic changes by a magnetic current sensor; another is a type detecting an integrated value during a predetermined time period with detecting voltage between both ends of a current-detecting resister. The type with the magnetic current sensor has the advantage that the current can be detected in high rate with predetermined sampling period. However, it is difficult to detect a current with accuracy in a large current range. Especially, it is tend to occur the error, when a large current is detected. In addition, in this type, the error of the detection can be also occurred cause of the influence of the remanence of the sensor itself. Thus, it is difficult to detect the current with accuracy in a large current range in this type. On the other hand, the type cumulating the voltage of the current-detecting resister has the advantage that the current can be detected with high accuracy. However, there is a detecting-incapable time period, which is incapable of detecting a current, for example the timing to communicate about the calculated current. Thus, the current cannot be detected in all time period with high accuracy. Especially, the error should be increased when the current changes in the detecting-incapable time period, so that it has the disadvantage that the current changing sharply cannot be detected with accuracy.

The invention was developed with the aim of eliminating these drawbacks. An important object of the invention is therefore to provide to a method and a device for detecting a current with high accuracy, even if the current changes sharply.

SUMMARY OF THE INVENTION

In the method for detecting a current of the invention, the current is detected by a first current sensor with a predetermined sampling period as a digital value, and is detected by a second current sensor with high accuracy with a period longer than the first current sensor as a digital value. Further, the current during detecting-incapable time period, which is incapable of detecting the current between detecting timings for detecting the current in the predetermined period by the second current sensor, is complemented with the current value detected by the first current sensor.

In the method for detecting a current of the invention, the current can be detected by the first current sensor and the second current sensor asynchronously. In this method for detecting the current of the invention, a detecting time period detecting the current by the second current sensor is calculated with comparing the detected current of the second current sensor with the detected current of the first current sensor, the detecting-incapable time period is specified based on the calculated detecting time period, and the current during the detecting-incapable time period is complemented with the detected current of the first current sensor.

The device for detecting a current includes a first current sensor detecting the current with predetermined sampling period, and a second current sensor detecting the current with high accuracy with a period longer than the first current sensor. In the device, the second current sensor detects the current with the predetermined period, and the current during a detecting-incapable time period, which is incapable of detecting the current by the second current sensors, is complemented with the current value detected by the first current sensor.

The device for detecting a current further includes a calculating circuit calculating the current value based on the detected currents of the first current sensor and the second current sensor, and the first current sensor and the second current sensor can detect the current asynchronously. The calculating circuit calculates a detecting time period detecting the current by the second current sensor with comparing the detected current of the second current sensor with the detected current of the first current sensor, specifies the detecting-incapable time period based on the calculated detecting time period, and complements the current during the detecting-incapable time period with the detected current of the first current sensor.

The method and the device for detecting a current mentioned above have the advantage that the current can be detected with high accuracy, even if the current changes sharply. The reason is that combining the first current sensor detecting the current with predetermined sampling period and the second current sensor detecting the current with high accuracy with a period longer than the first current sensor can complement the current during detecting-incapable time period, which is incapable of detecting the current by the second current sensor, with the current value detected by the first current sensor. Further, the method and the device mentioned above complement the current during the detecting-incapable time period in the second current sensor, which can detect a current with high accuracy but cannot detect all the time period, with the current value detected by the first current sensor. Thus, the advantages of both sensors can obtain the higher accurate current value than each sensor alone.

Furthermore, in the invention, even if the second current sensor does not work temporarily, or the data cannot be read cause of noise or the like, the first current sensor can complement with detecting the current value. Therefore, the accurate current value can be detected all the time, and it is advantageous to achieve high reliability.

The above and further objects and features of the invention will more fully be apparent from the following detailed description with accompanying drawings.

DETAILED DESCRIPTION OF THE PREFERED EMBODIMENTS

Figure 1:
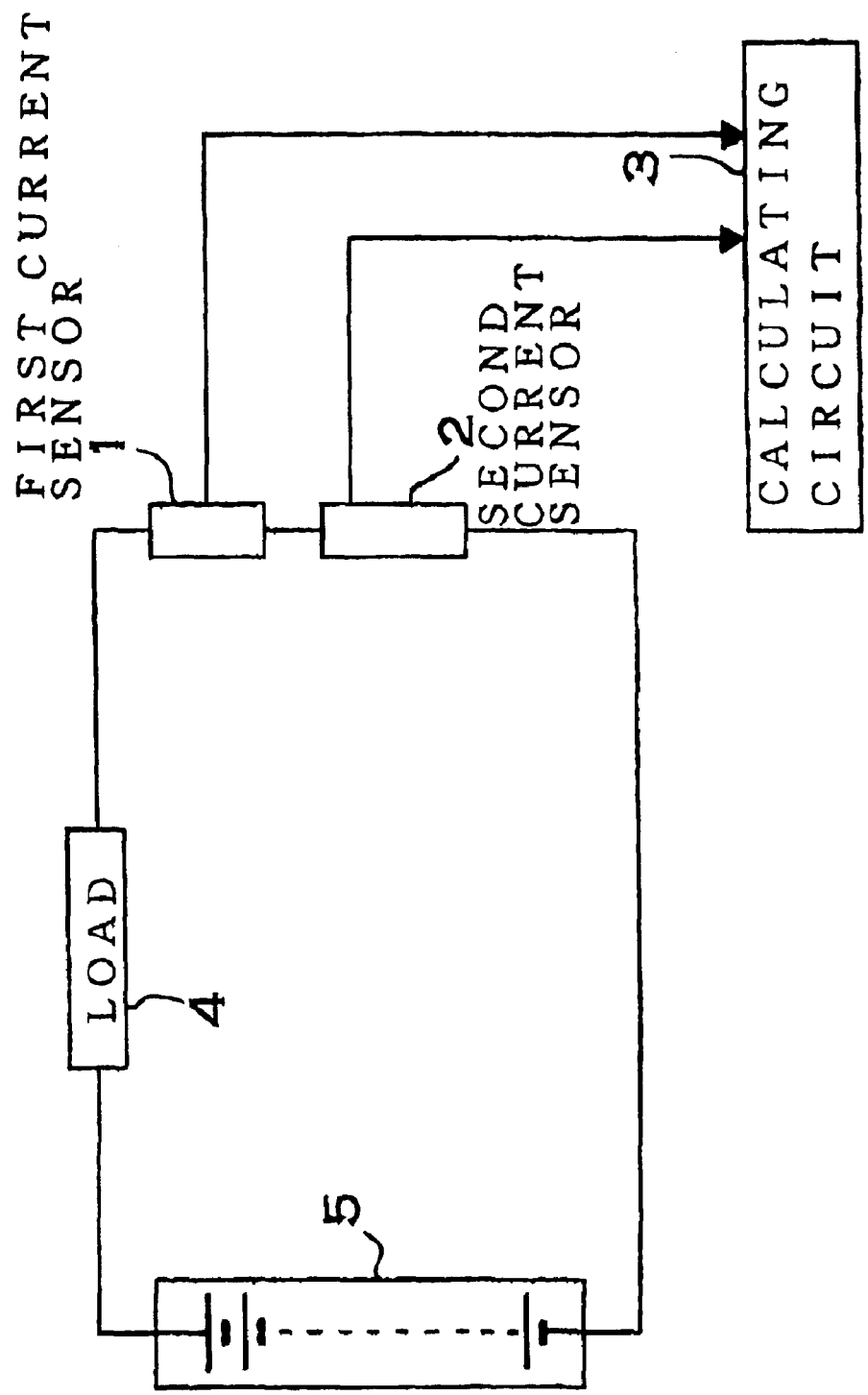
FIG. 1 is a block diagram according to an embodiment of the invention.

A device for detecting a current of FIG. 1 includes: a first current sensor 1 detecting the current with predetermined sampling period; a second current sensor 2 detecting the current with high accuracy with a period longer than the first current sensor 1; and a calculating circuit 3 calculating the current accurately based on the detected currents input from the first current sensor 1 and the second current sensor 2.

Figure 2:
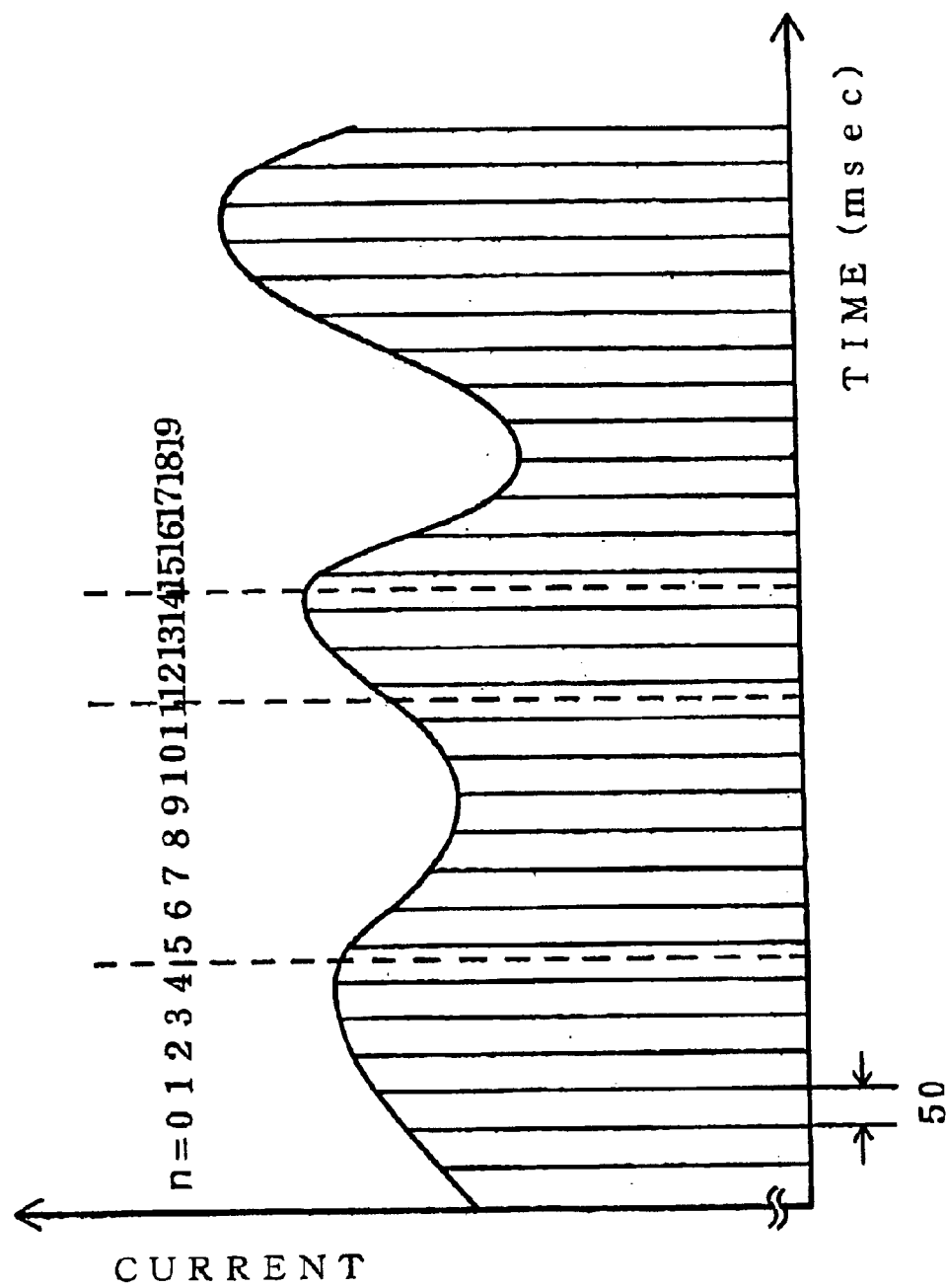
FIG. 2 is a graph showing the state, in which a first current sensor detects a current.

The first current sensor 1 and the second current sensor 2 are connected with each other serially, and are connected with a load 4 serially. The first current sensor 1 outputs a digital value of detected signal to the calculating circuit 3 with a sampling period shorter than the second current sensor 2. The current sensor 1 is composed of a magnetic current sensor, which detects a current based on magnetic changes. However, it is appreciated that the first current sensor may be a type of detecting circuit, which connects a current detecting resistor with low resistance with the load serially, and amplifies the voltage, which is produced between both ends of the current detecting resistor by the current flow, with an amplifier. As shown in FIG. 2, the detected current signal is converted into the digital value of the current signal with the constant sampling period by an A/D converter (not shown). The AND converter converts the current value, which is obtained in sampling with the predetermined period, into the digital value. The A/D converter of the first current sensor 1 shown in the drawing converts the detected current into the digital value with the sampling period of 50 msec, and outputs it to the calculating circuit 3. In addition, the A/D converter of the first current sensor can convert into the digital value with the sampling period of 50 $\mu$sec–200 msec for example. It is preferable that it is 1–100 msec. It is more preferable that it is 10–100 msec. The first current sensor 1 contains a timer (not shown) specifying the sampling period. The timer outputs a clock signal with constant period to the A/D converter. The A/D converter converts the current obtained with sampling based on the clock signal from the timer, and outputs the digital value.

Figure 3:
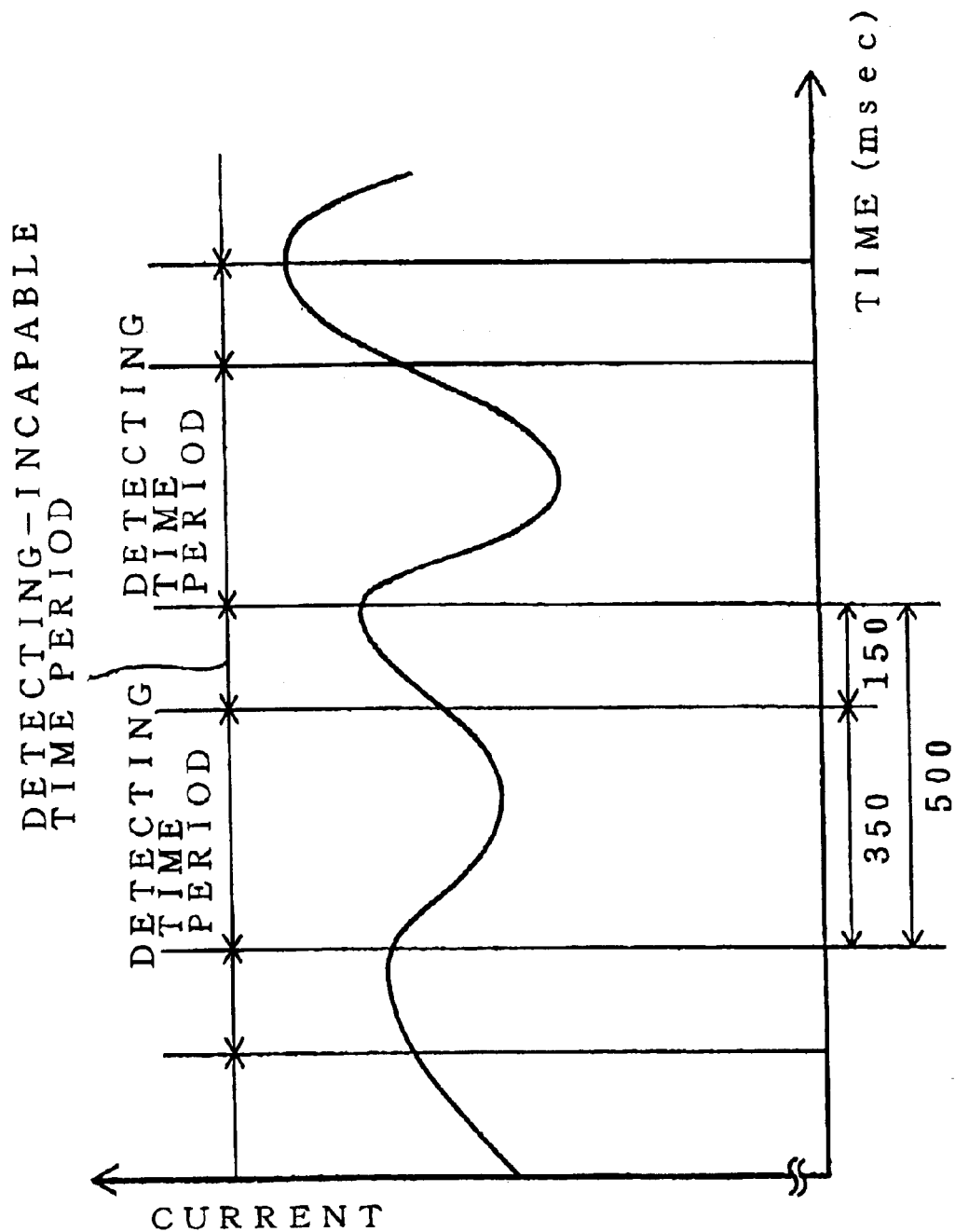
FIG. 3 is a graph showing the time period, in which a second current sensor detects a current.

The second current sensor 2 detects the current with. the period longer than the first current sensor 1 though with high accuracy, and converts the current into the digital value, then outputs it. As shown in FIG. 3, the second current sensor 2 integrates the current during the predetermined time period, and measures the accurate average based on the integrated value, then outputs it as the digital value. As shown in the drawing, though the second current sensor 2 detects the current accurately with the predetermined period, cannot detect the current in all the time period. There is the detecting-incapable time period between the detecting time periods. In the detecting-incapable time period, the second current sensor 2 calculates the current based on the current value integrated during the detecting time period, and converts it into the digital value, then further communicates the digital value of the current value with the calculating circuit 3. In the second current sensor 2 of the drawing, the detecting time period is 350 msec, and the detecting-incapable time period is 150 msec, so that one cycle of the period composed of the detecting time period and the detecting-incapable time period is 500 msec. However, the detecting time period and the detecting-incapable time period in the second current sensor 2 are not restricted in these times. For example, the detecting time period can be 1.5–1000 times as long as the sampling period in the first current sensor 1. It is preferable that it is 3–100 times. It is more preferable that it is 5–10 times. Additionally, the detecting-incapable time period can be 10–100% against the detecting time period.

Although the second current sensor 2 of FIG. 3 detects the current, and outputs it to the calculating circuit 3 as the digital value with the period 500 msec, this period does not synchronize with the sampling period of the first current sensor 1. In other word, though the first current sensor 1 and the second current sensor 2 detect the current with constant periods, each of them detects the current, and outputs it outputs to the calculating circuit 3 asynchronously. That is, the first current sensor 1 and the second current sensor 2 output to the calculating circuit 3 with detecting the current independently each other. Although the second current sensor 2 contains a timer (not shown) specifying the timing for detecting the current, this timer outputs a clock signal asynchronously without synchronizing with the timer of the first current sensor 1.

The second current sensor 2 includes: a current detecting resistor with low resistance connected with the load 4 serially; an amplifier amplifying the voltage produced between both ends of the current detecting resistor; a current detecting circuit calculating the current with accuracy with integrating the output voltage of the amplifier in a constant time period; and an A/D converter A/D-converting the output of the current detecting circuit, in the current detecting resistor, the voltage is produced proportionately with the current flowed in a battery 5. The charge current and the discharge current are opposite in direction to each other in the battery 5, so that the voltages produced at the current detecting resistor in the charge current and the discharge current are also opposite in the polarity to each other. Thus, it is possible to measure the current flowed in the battery 5 with detecting the voltage produced at the current detecting resistor. The amplifier is provided for reducing the voltage so that the resistance of the current detecting resistor is reduced. The accurate current value during the detecting time period can be output to the calculating circuit 3 in the detecting-incapable time period.

The calculating circuit 3 calculates the digital values of the current signals input from the first current sensor 1 and the second current sensor 2, and calculates the accurate current. The current signals are input from the first current sensor 1 and the second current sensor 2 with constant periods, but not synchronized each other. As shown in FIG. 2, the first current sensor 1 outputs the current signal to the calculating circuit 3 with the period of 50 msec. As shown in FIG. 3, the second current sensor 2 outputs the current signal with the period of 500 msec. Although the second current sensor 2 outputs the current signal with the period of 500 msec, the current signal is not the current value during 500 msec. It outputs the average current during the time period of 350 msec, which is the detecting time period, to the calculating circuit 3 in the detecting-incapable time period. The current value of second current sensor 2 is higher accurate than the current value of first current sensor 1, but is not the current value in all the time period. The current value during the detecting-incapable time period, which is incapable of detecting the current by the second current sensor 2, is complemented with the current value detected by the first current sensor 1.

Because the outputs of the second current sensor 2 and the first current sensor 1 do not synchronized each other, the calculating circuit 3 compares the detecting current of the second current sensor 2 with the detecting current of the first current sensor 1, and calculates the detecting time period, in which the second current sensor 2 detects the current. Because the time periods detecting the current in the first current sensor 1 and the second current sensor 2 are different; with adjusting the time period, the current values are compared. The first current sensor 1 of FIG. 1 detects the current with the sampling period of 50 msec, and the second current sensor 2 of FIG. 3 detects the current during 350 msec. In this case, the time, in which the first current sensor 1 detects seven times continuously, corresponds to the detecting time in the second current sensor 2. Thus, the average value of the detected values in seven times in the first current sensor 1 is compared with the detected value in the second current sensor 2. When the times, in which the first current sensor 1 and the second current sensor 2 detect the current, agree, the detected current values are equal or the most approximate detected values. The second current sensor 2 detects the current with higher accuracy than the first current sensor 1. So that, even the time periods, in which the first current sensor 1 and the second current sensor 2 detect the current, agree, the both detected values in the first current sensor 1 and the second current sensor 2 are not always equal. In addition, when the time periods, in which both of current sensors detect the current, agree, the detected values may not be equal though should be the most approximate detected values. Thus, the calculating circuit 3 determines agreement of the times, in which the first current sensor 1 and the second current sensor 2 detect the current, with comparing the current values of the first current sensor 1 and the second current sensor 2 in consideration of the error, or when the detected values are the most approximate detected values.

As shown in FIG. 2, when the detecting time period of the first current sensor 1 is specified with comparing the detected values of the first current sensor 1 and the second current sensor 2, the detecting-incapable time period is also specified. In FIG. 2, the detecting-incapable time period is 150 msec, so that the first current sensor 1 detects the current three times continuously during this time period. Therefore, the current value during the detecting-incapable time period in the second current sensor 2 is complemented based on detected currents of these three times The calculating circuit 3 includes a buffer memory (not shown) storing the current value input from the first current sensor 1 during predetermined time. The buffer memory can store at least the current values input from the first current sensor 1 during more than or equal to one cycles of the second current sensor 2. It is preferable that the buffer memory can store the current values output from the first current sensor 1 during the time periods corresponding to more than or equal to 1.5 cycles, for example two cycles. When the one cycle of the second current sensor 2 is 500 msec, the buffer memory stores the detected values output from the first current sensor 1 during 1 sec. The time, in which the buffer memory stores, is set the time to include the detecting time period of the second current sensor 2.

The calculating circuit 3 compares the current values of the first current sensor 1 stored in the buffer memory with the current value input from the second current sensor 2, then specifies the detecting time period of the second current sensor 2 in the first current sensor 1. The average value of seven times in the current values of the first current sensor 1 stored in the buffer memory is compared with the detected value of the second current sensor 2, Thus, the time width, in which the first current sensor 1 detects the current, agrees the time width, in which the second current sensor 2 detects the current. As mentioned above, the calculating circuit 3 calculates the current value based on the current values of the first current sensor 1 stored in the buffer memory with adjusting the time width in which the second current sensor 2 detects the current, and compares the calculated current value with the detected value of the second current sensor 2.

The calculating circuit 3 compares the values of the first current sensor 1 and the second current sensor 2, and synchronizes the current signals asynchronous to each other output from the first current sensor 1 and the second current sensor 2. Because the both of the time sampling the current in the first current sensor 1 and the time detecting the current in the second current sensor 2 are specified.

The calculating circuit 3 complements the current value of the detecting-incapable time period in the second current sensor 2 with the current value of the first current sensor 1. The calculating circuit 3 stores the current values input from the first current sensor 1 into the buffer memory. The buffer memory stores the current values input from the first current sensor 1 during one second repeatedly. The first current sensor 1 detects the current value with 50 msec of the sampling period, so that the current values are detected 20 times during one second. Thus, the buffer memory stores the 20 times of the detected current values detected by the first current sensor 1 continuously in the digital values as n=0–19. The current value of the first current sensor 1 stored in the buffer memory includes the current values during the time period corresponding to the detecting time period of the current value input from the second current sensor 2. In other word, the buffer memory stores the current values of the first current sensor 1 so as to include the current values corresponding to the detecting time period of the second current sensor 2.

Figure 4:
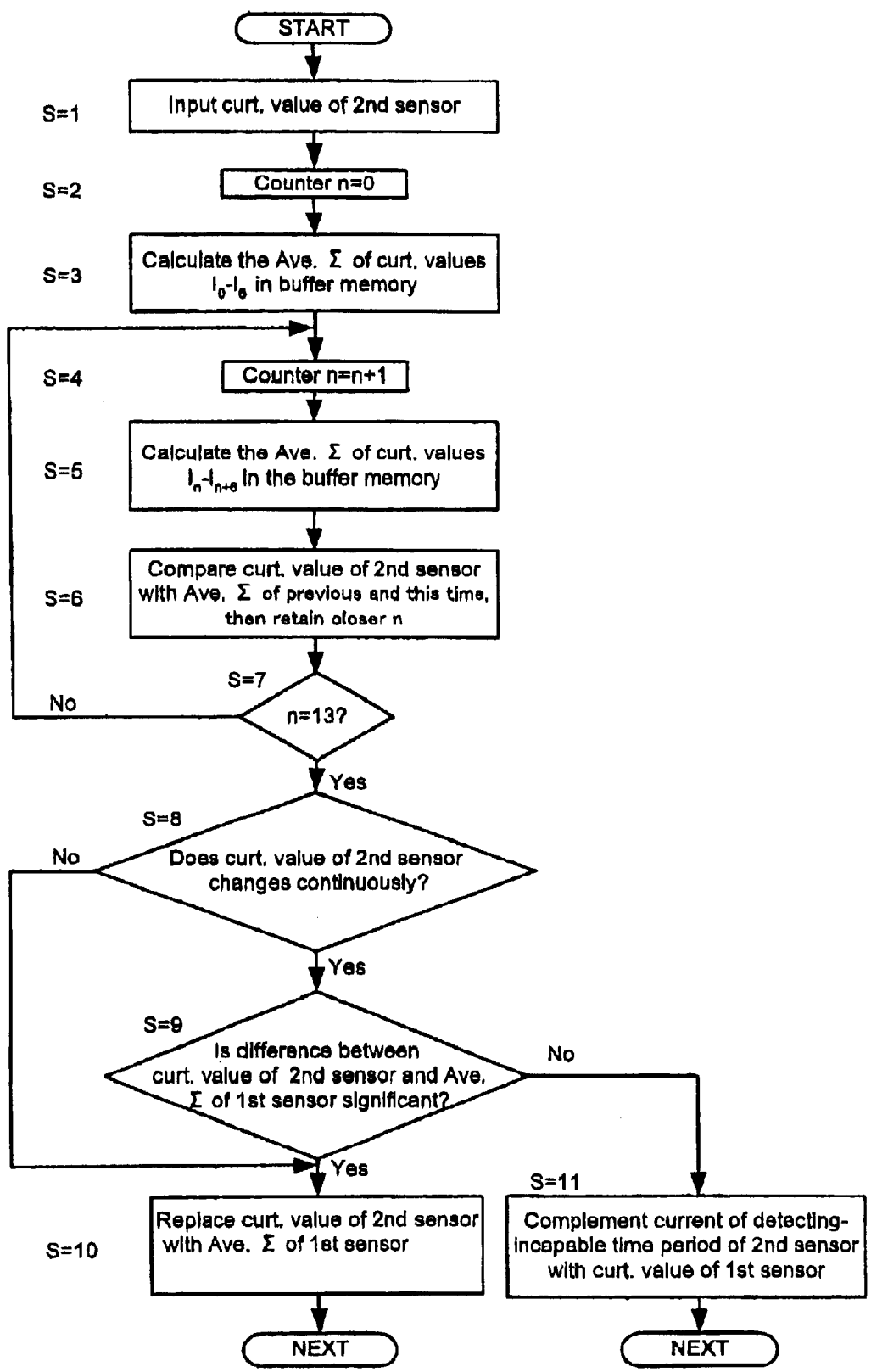
FIG. 4 is a flowchart showing the process, in which a calculating circuit complements the current value during the detecting-incapable time period in the second current sensor with the current value of the first current sensor.

The calculating circuit 3 calculates the current value with accuracy in all the time based on the detected values of the second current sensor 2 and the first current sensor 1, or the current including the current value even during the detecting-incapable time period of the second current sensor 2, as the flowchart shown in FIG. 4.

Step S=1

In this step, the calculating circuit 3 reads the accurate current value detected by the second current sensor 2. The calculating circuit 3 reads the current value detected by the second current sensor 2 every 500 msec.

Step S=2

The calculating circuit 3 sets an on-board counter in "n=0".

Step S=3

The calculating circuit 3 integrates the current values 10–16 as n=0–6 stored in the buffer memory, and calculates the average value S. The average value S of the current values 10–16 detected by the first current sensor 1 has same time width with average current value of 350 msec, in which the second current sensor 2 detects the current. In addition, the average value S detected by the first current sensor 1 does not synchronize the time, in which the second current sensor 2 detects the current, so that they are synchronized in the steps below.

Step S=4

The value of the, counter of the calculating circuit 3 is increment by 1. That is, the counter is set in "n=1".

Step S=5

In this step, the calculating circuit 3 calculates the average value S of the current values 11–17 as n=1–7 detected by the first current sensor 1.

Step S=6

The previous average value S and this time average value S are compared respectively with the current value detected by the second current sensor 2, then n at which the average value S is closer is retained.

Step S=7

The loop of steps of S=4–7 executes until "n=13". In the steps of S=4–7, the calculating circuit 3 retains n of the closest average value S to the current value detected by the second current sensor 2.

The time period detected by the first current sensor 1 synchronizes with the time period detected by the second current sensor 2 based on the value n. As shown in FIG. 2, if the time period, in which the second current sensor 2 detects the current, corresponds to the time period including n=5–11 of timing, in which the first current sensor 1 detects the current, the average value S of n=5–11 stored in the buffer memory should be the closest to the current value detected by the second current sensor 2. Because the time, in which the first current sensor 1 detects the current in timings n=5–10, agree with the time, in which the second current sensor 2 detects the current, or the detecting time period of the second current sensor 2.

When the average value S of seven times of the current values detected in n=5–11 by the first current sensor 1 is calculated as the detecting time period of the second current sensor 2, the average value of next three times after the average S is set as the current during the detecting-incapable time period in the second current sensor 2. Because the time period of the detecting time period in the second current sensor 2 is 350 msec, and the 150 msec of time period after the detecting time period is the detecting-incapable time period as shown in FIG. 2. Therefore, the average value of the current values of I12–I14 as n=12–14 stored in the buffer memory can complement the current value of the detecting-incapable time period in the second current sensor 2. That is, the calculating circuit 3 selects the current value during the time period of n=5–11 detected by the first current sensor 1, which is the higher accurate detected value of the second current sensor 2, and select the current value of n=12–14 stored in the buffer memory during the detecting-incapable time period, which is Incapable of detecting the current by the second current sensor 2. Thus, the calculating circuit 3 complements the current value during the detecting-incapable time period in the second current sensor 2 with the detected value of the first current sensor 1, so that can detect the continuous current value accurately.

As the above steps are repeated, the calculating circuit 3 calculates the current value more accurately based on the first current sensor 1 and the second current sensor 2.

Further, in the flowchart of FIG. 4, the current during the detecting-incapable time period in the second current sensor 1 is complemented with the detected value in the first current sensor 1 in the step of S=11 after step selecting the detected value of the first current sensor 1, when the second current sensor 2 cannot detect the current with accuracy.

Step S=8

In this step, the calculating circuit 3 determines whether the current value input from the second current sensor 2 changes continuously or not. When the second current sensor 2 detects the current under abnormal condition, the current value changes sharply. Therefore, it is confirmed whether the detected value of the second current sensor 2 changes sharply or not, that is whether the second current sensor 2 detects the current under normal condition.

Step S=9

Further, in this step, the calculating circuit 3 compares the detected value of the second current sensor 2 with the average S of the first current sensor 1, and determines whether the difference between them is large or not. When the second current sensor 2 is under abnormal detecting condition, the difference between the detected value of the second current sensor 2 and the average S of the first current sensor 1 is large. Thus, in this step, it is also determined whether the second sensor detects the current under normal condition or not.

Step S=10

When the detected value of the second current sensor 2 does not change continuously, or the difference between the detected value of the second current sensor 2 and the average S of the first current sensor 1 is large; the detected value of the second current sensor 2 is not selected, and the current is detected with replacing the average S of the first current sensor 1. That is, the detection of the second current sensor 2 is cancelled, and the detected value of the first current sensor 1 is selected.

Step S=11

When the detected value of the second current sensor 2 changes continuously, or the difference between the detected value of the second current sensor 2 and the average S of the first current sensor 1 is not large, that is, the second current sensor 2 detects the current under normal condition, as the above method, the current during the detecting-incapable time period in the second current sensor 2 is complemented with the current value of the first current sensor 1.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A method for detecting a current comprising the steps of:

detecting the current by a first current sensor with a predetermined sampling period as a digital value, and for detecting the current by a second current sensor with high accuracy with a period longer than that of the first current sensor as a digital value; and complementing the current during a detecting-incapable time period, which is incapable of detecting the current between detecting timings for detecting the current in the predetermined period by the second current sensor, with the current value detected by the first current sensor.

2. The method according to claim 1, wherein the current is detected by the first current sensor and the second current sensor asynchronously, a detecting time period detecting the current by the second current sensor is calculated with comparing the detected current of the second current sensor with the detected current of the first current sensor, the detecting-incapable time period is specified based on the calculated detecting time period, and the current during the detecting-incapable time period is complemented with the detected current of the first current sensor.

3. The method according to claim 1, wherein the current is detected based on magnetic changes by a magnetic current sensor in the first current sensor.

4. The method according to claim 1, wherein the first current sensor detects the current with the sampling period of 50 $\mu$sec–200 msec.

5. The method according to claim 1, wherein the second current sensor detects the current with integrating the current during a predetermined time period, and with averaging the integrated value.

6. The method according to claim 1, wherein the second current sensor repeats the detecting time period detecting the current and the detecting-incapable time period not detecting the current, and the current value, which is calculated based on the current value integrated during the detecting time period, is converted into the digital value in the detecting-incapable time period.

7. The method according to claim 6, wherein the detecting time period is 1.5–1000 times as long as the sampling period in the first current sensor.

8. The method according to claim 1, wherein the second current sensor detects the current with detecting the voltage produced between both ends of a current-detecting resister connected with a load serially.

9. A device for detecting a current comprising:

a first current sensor detecting the current with predetermined sampling period; and a second current sensor detecting the current with high accuracy with a period longer than that of the first current sensor;

wherein the second current sensor detects the current with the predetermined period, and the current during a detecting-incapable time period, which is incapable of detecting the current by the second current sensor, is complemented with the current value detected by the first current sensor.

10. The device according to claim 9 further comprising:

a calculating circuit calculating the current value based on the detected currents of the first current sensor and the second current sensor, wherein the first current sensor and the second current sensor detect the current asynchronously, and the calculating circuit calculates a detecting time period detecting the current by the second current sensor with comparing the detected current of the second current sensor with the detected current of the first current sensor, specifies the detecting-incapable time period based on the calculated detecting time period, and complements the current during the detecting-incapable time period with the detected current of the first current sensor.

11. The device according to claim 9, wherein the current is detected based on magnetic changes by a magnetic current sensor in the first current sensor.

12. The device according to claim 9, wherein the first current sensor detects the current with the sampling period of 50 $\mu$sec–200 msec.

13. The device according to claim 9, wherein the second current sensor detects the current with integrating the current during a predetermined time period, and with averaging the integrated value.

14. The device according to claim 9, wherein the second current sensor repeats the detecting time period detecting the current and the detecting-incapable time period not detecting the current, and the current value, which is calculated based on the current value integrated during the detecting time period, is converted into the digital value in the detecting-incapable time period.

15. The device according to claim 14, wherein the detecting time period is 1.5–1000 times as long as the sampling period in the first current sensor.

16. The device according to claim 9, wherein the second current sensor detects the current with detecting the voltage produced between both ends of a current-detecting resister connected with a load serially.

* * * * *